(12) United States Patent
Wijesundera et al.

(10) Patent No.: US 10,571,521 B2
(45) Date of Patent: Feb. 25, 2020

(54) DIAGNOSIS OF SWITCH STUCK OPEN CONDITION FOR A BUTTON THAT ACTUATES THREE OR MORE SWITCHES

(71) Applicant: GM Global Technology Operations LLC, Detroit, MI (US)

(72) Inventors: Dhammika S. Wijesundera, Ann Arbor, MI (US); Ming Zhao, Northville, MI (US); Joshua McDonough, Novi, MI (US); Junghyun Kim, South Lyon, MI (US)

(73) Assignee: GM Global Technology Operations, LLC, Detroit, MI (US)

( * ) Notice: Subject to any disclaimer, the term of this patent is extended or adjusted under 35 U.S.C. 154(b) by 106 days.

(21) Appl. No.: 15/992,782

(22) Filed: May 30, 2018

(65) Prior Publication Data
US 2019/0369164 A1 Dec. 5, 2019

(51) Int. Cl.
*G01R 31/327* (2006.01)
*G01R 31/00* (2006.01)

(52) U.S. Cl.
CPC ....... *G01R 31/3277* (2013.01); *G01R 31/007* (2013.01)

(58) Field of Classification Search
CPC .............. G01R 23/02; G01R 31/2824
USPC .............. 324/415, 76.31, 76.11, 76.41
See application file for complete search history.

(56) References Cited

U.S. PATENT DOCUMENTS

| | | | |
|---|---|---|---|
| 9,334,948 B2 | 5/2016 | Wang et al. | |
| 9,599,216 B2 | 3/2017 | Bialas et al. | |
| 2017/0060150 A1* | 3/2017 | Stefanski | G05D 23/27 |
| 2018/0036740 A1* | 2/2018 | Nelson | B02C 19/18 |
| 2018/0047534 A1 | 2/2018 | Zhao | |
| 2018/0059176 A1* | 3/2018 | Ding | G01R 35/005 |

* cited by examiner

*Primary Examiner* — Giovanni Astacio-Oquendo
(74) *Attorney, Agent, or Firm* — Vivacqua Law, PLLC (57) ABSTRACT

A method for detecting a failure mode in an electronic selector having a button coupled to a first switch, a second switch, and a third switch, the method includes incrementing a button activation counter once for each button activation event and incrementing a first switch-closed counter, a second switch-closed counter, and a third switch-closed counter once for each button activation event if the respective switch is closed at any time during the button activation event. The method further includes incrementing a first switch-opened counter, a second switch-opened counter, and a third switch-opened counter once for each button activation event. The method further includes evaluating a fault status of the first switch, the second switch, or the third switch when the button activation counter reaches or exceeds a predetermined threshold; and reporting the fault status of the first switch, the second switch or the third switch.

20 Claims, 3 Drawing Sheets

DIAGNOSIS OF SWITCH STUCK OPEN CONDITION FOR A BUTTON THAT ACTUATES THREE OR MORE SWITCHES

INTRODUCTION

The present disclosure relates to a pushbutton shifter assembly with button state determination logic.

In a conventional vehicle having an automatic transmission, a driver manually selects a desired transmission range using a multi-position Park, Reverse, Neutral, Drive, and Low (PRNDL) lever. For instance, the driver could move the PRNDL lever to a drive (D) position to thereby select a forward drive operating range. A typical PRNDL lever is mechanically coupled to a detent lever and a manual valve assembly, usually via a length of cable. Movement of the PRNDL lever rotates the detent lever, which in turn shifts the transmission to the selected operating range. Shift logic thereafter automatically controls the progression of gears occurring during any required gear shift within the selected operating range.

An alternative shift-by-wire transmission design is characterized by a plurality of pushbuttons in place of the PRNDL lever and the detent lever/manual valve assembly. Transmission operating range selection in a pushbutton shift-by-wire design instead occurs by way of electronic control signals transmitted to an actuator configured to place the transmission into the selected range.

Each of the plurality of pushbuttons may actuate a plurality of underlying switches associated with the pushbutton. The state of each of the plurality of underlying switches may be compared with the states of the other underlying switches associated with the pushbutton, and control decisions may be made based on such a comparison. In this way, the operation of the system can be made more robust against inadvertent pushbutton actuation, as well as against improper control actions resulting from degradation of an underlying switch.

In addition to the control decisions that determine the operation of the system, additional diagnostic methods are desirable to allow detection of degradation of the operation of the underlying switches before such degradation reaches a level that would interfere with the operation of the system.

Thus, while current shift-by-wire systems achieve their intended purpose, there is a desire for a new and improved diagnostic system and method for shift-by-wire systems.

SUMMARY

According to several aspects, a method for detecting a failure mode in an electronic selector having a button coupled to a first switch, a second switch, and a third switch, includes the steps of incrementing a button activation counter once for each button activation event, incrementing a first switch-closed counter once for each button activation event if the first switch is closed at any time during the button activation event, incrementing a second switch-closed counter once for each button activation event if the second switch is closed at any time during the button activation event, and incrementing a third switch-closed counter once for each button activation event if the third switch is closed at any time during the button activation event. The method further includes the steps of incrementing a first switch-opened counter once for each button activation event, incrementing a second switch-opened counter once for each button activation event, and incrementing a third switch-opened counter once for each button activation event. The method further includes evaluating a fault status of the first switch, the second switch, or the third switch by analyzing values of the first switch-closed counter, and/or the second switch-closed counter, and/or the third switch-closed counter, and/or the first switch-opened counter, and/or the second switch-opened counter, and/or the third switch-opened counter when the button activation counter reaches or exceeds a predetermined threshold. The method also includes reporting the fault status of the first switch, the second switch or the third switch.

In an additional aspect of the present disclosure, the fault status is that a switch not stuck open status is confirmed.

In another aspect of the present disclosure, the fault status is that a switch not stuck open status cannot be confirmed.

In a still further aspect of the present disclosure, the fault status is that a switch stuck open status is confirmed.

In an additional aspect of the present disclosure, the fault status is that a switch stuck open status cannot be confirmed.

In yet another aspect of the present disclosure, a first open-to-closed debounce time is applied to signals from the first switch, the second switch, and the third switch; a first closed-to-open debounce time is applied to signals from the first switch, the second switch, and the third switch. The button activation event is commenced when one of the first switch with the first open-to-closed debounce time applied, the second switch with the first open-to-closed debounce time applied, and the third switch with the first open-to-closed debounce time applied is recognized as closed. The button activation event is concluded when the first switch with the first closed-to-open debounce time applied, the second switch with the first closed-to-open debounce time, and the third switch with the first closed-to-open debounce time applied are all recognized as open.

In an additional aspect of the present disclosure, a second open-to-closed debounce time is applied to signals from the first switch, the second switch, and the third switch, the second open-to-closed debounce time being shorter than the first open-to-closed debounce time. Recognition that the first switch is closed in the step of incrementing the first switch-closed counter once if the first switch is closed at any time during the button activation event is based on the signal from the first switch with the second open-to-closed debounce time applied.

In an additional aspect of the present disclosure, the method further includes the step of reporting an impending failure of the button when the fault status is that a stuck open status is detected for only one of the three switches.

In another aspect of the present disclosure, the method further includes the step of reporting a total failure of the button when the fault status is that a stuck open status is detected for two of the three switches.

In yet an additional aspect of the present disclosure, the method further includes the step of reporting a no button latent failure is confirmed status when the fault status is that that a switch not stuck open status can be confirmed for all three of the switches.

According to several aspects of the disclosure, a system includes an electronic selector having a button coupled to a first switch, a second switch, and a third switch, and a controller in electrical communication with the first switch, the second switch, and the third switch. The controller is configured to increment a button activation counter once for each button activation event, increment a first switch-closed counter once for each button activation event if the first switch is closed at any time during the button activation event, increment a second switch-closed counter once for each button activation event if the second switch is closed at any time during the button activation event, and increment a third switch-closed counter once for each button activation event if the third switch is closed at any time during the button activation event. The controller is also configured to increment a first switch-opened counter once for each button activation event, increment a second switch-opened counter once for each button activation event, and increment a third switch-opened counter once for each button activation event. The controller is also configured to evaluate a fault status of the first switch, the second switch, or the third switch when the button activation counter reaches or exceeds a predetermined threshold; and to report the fault status of the first switch, the second switch or the third switch.

In an additional aspect of the present disclosure, the fault status is that a switch not stuck open status is confirmed.

In another aspect of the present disclosure, the fault status is that a switch not stuck open status cannot be confirmed.

In an additional aspect of the present disclosure, the fault status is that a switch stuck open status is confirmed.

In yet another aspect of the present disclosure, the fault status is that a switch stuck open status cannot be confirmed.

In a further aspect of the present disclosure, a first open-to-closed debounce time is applied to signals from the first switch, the second switch, and the third switch, and a first closed-to-open debounce time is applied to signals from the first switch, the second switch, and the third switch. The button activation event is commenced when one of the first switch with the first open-to-closed debounce time applied, the second switch with the first open-to-closed debounce time applied, and the third switch with the first open-to-closed debounce time applied is recognized as closed. The button activation event is concluded when the first switch with the first closed-to-open debounce time applied, the second switch with the first closed-to-open debounce time, and the third switch with the first closed-to-open debounce time applied are all recognized as open.

In an additional aspect of the present disclosure, a second open-to-closed debounce time is applied to signals from the first switch, the second switch, and the third switch, the second open-to-closed debounce time being shorter than the first open-to-closed debounce time. Recognition that the first switch is closed in the step of incrementing the first switch-closed counter once if the first switch is closed at any time during the button activation event is based on the signal from the first switch with the second open-to-closed debounce time applied.

Another aspect of the present disclosure further includes the step of reporting an impending failure of the button when the fault status is that a stuck open status is detected for only one of the three switches.

Yet another aspect of the present disclosure includes the step of reporting a total failure of the button when the fault status is that a stuck open status is detected for two of the three switches.

According to several aspects of the present disclosure, a controller includes a processor and a non-transitory computer-readable medium containing instructions that, when executed, perform the method comprising the steps of incrementing a button activation counter once for each button activation event, incrementing a first switch-closed counter once for each button activation event if a first switch is closed at any time during the button activation event, incrementing a second switch-closed counter once for each button activation event if a second switch is closed at any time during the button activation event, and incrementing a third switch-closed counter once for each button activation event if a third switch is closed at any time during the button activation event. The method further includes the steps of incrementing a first switch-opened counter once for each button activation event, incrementing a second switch-opened counter once for each button activation event, and incrementing a third switch-opened counter once for each button activation event. The method further includes evaluating a fault status of the first switch, the second switch, or the third switch by analyzing values of the first switch-closed counter, and/or the second switch-closed counter, and/or the third switch-closed counter, and/or the first switch-opened counter, and/or the second switch-opened counter, and/or the third switch-opened counter when the button activation counter reaches or exceeds a predetermined threshold. The method also includes reporting the fault status of the first switch, the second switch or the third switch.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
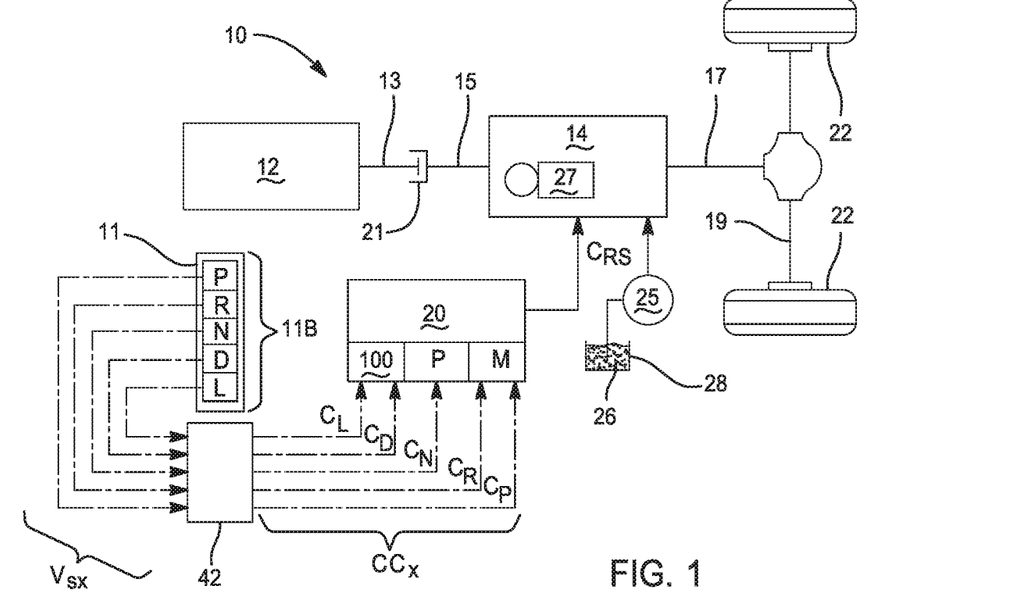
FIG. 1 is a schematic illustration of an example vehicle having a by-wire pushbutton shifter assembly and a controller programmed to determine when a given pushbutton of the range shifter assembly has been selected or released according to an exemplary embodiment.

Referring to the drawings wherein like reference numbers correspond to like or similar components throughout the several figures, a system in the form of an example vehicle 10 is shown schematically in FIG. 1. The vehicle 10 includes an electronic selector in the form of a pushbutton shifter assembly 11 as explained below and may also include an internal combustion engine 12 and a transmission 14 depending on the design. As shown, the transmission 14 includes an input member 15 and an output member 17. The output member 17 ultimately delivers output torque from the transmission 14 to a drive axle 19 to power a set of drive wheels 22. A torque input device 21 such as a friction clutch and damper assembly or a hydrodynamic torque converter may be disposed between an output shaft 13 of the engine 12 and the input member 15 so as to control engagement and damping of the engine 12 with the transmission 14. In some embodiments of the transmission 14, fluid pressure may be provided via a fluid pump 25 that draws fluid 26 from a sump 28. Dry transmissions may omit the fluid pump 25, fluid 26, and sump 28. Likewise, the vehicle 10 may be an electric vehicle, and thus the particular powertrain components of the vehicle 10 as shown in FIG. 1 are merely exemplary of one possible design.

The vehicle 10 also includes an electronically-controlled actuator assembly 27, such as a motor or linear actuator-driven detent lever and main valve assembly of the type known in the art, and a controller 20. The controller 20 is programmed to determine a selected, released, or unknown button state of each of a plurality of pushbuttons 11B of the pushbutton shifter assembly 11 via a method 100 as explained below. The actuator assembly 27, which is in electrical communication with the pushbutton shifter assembly 11 via the controller 20, is operable to achieve a selected operating state of the vehicle 10 in response to an electronic state selection signal (arrows $CC_X$). In the example configuration described herein, the selected operating state is a desired operating range of the transmission 14, and the electronic state selection signals (arrows $CC_X$) are respective operating ranges of the transmission 14, e.g., park (P), reverse (R), neutral (N), drive (D), and low (L), although the method 100 is not limited to such a system.

The actuator assembly 27, which is shown schematically in FIG. 1 for illustrative simplicity, may include any number of motors and/or linear actuators, hydraulic servo valves, fluid conduit, detent levers, springs, and/or other linkages and/or fluid control components needed for shifting the transmission 14 into a desired operating range. Transmission operating ranges typically include the PRNDL ranges noted above, although some designs may provide for selection of multiple low gear ranges such as L1, L2, and L3.

The pushbuttons 11B shown in the schematic example depiction of FIG. 1 include multiple individual pushbuttons, labeled P, R, N, D, and L in FIG. 1 for a typical PRNDL design, with each pushbutton 11B corresponding to a respective one of the possible PRNDL operating ranges. For instance, actuation of the pushbutton P requests a range shift of the transmission 14 to the park (P) range, actuation of the pushbutton R requests a range shift of the transmission 14 to the reverse (R) range, actuation of the pushbutton N requests a range shift of the transmission 14 to the neutral (N) range, actuation of the pushbutton D requests a range shift of the transmission 14 to the drive (D) range, and so forth. While the term "pushbutton" is used herein, the present disclosure is not intended to be limited to switches that are actuated by pressing on a button. It will be appreciated that the teachings of the present disclosure can be applied to a switch that is actuated by other actions, including but not limited to pulling or rocking a feature associated with the switch. In the present disclosure, the term "pushbutton" means any structure associated with the switch that, when actuated, results in the switch transitioning from an open to a closed state or from a closed to an open state.

The connections between each of the pushbuttons 11B and the actuator assembly 27 are characterized by an absence of mechanical couplings or linkages, such as the length of cable disposed between a PRNDL lever and a detent lever in a conventional PRNDL lever design of the type described above. Instead, all communication occurring between the pushbutton shifter assembly 11 and the actuator assembly 27 occurs electronically, i.e., by-wire. For example, low-voltage wires (not shown) or an auxiliary wiring harness may be routed from the pushbutton shifter assembly 11 to the controller 20, and a controller area network (CAN) bus (not shown) may connect the interface circuit 42 to the controller 20 or may connect the controller 20 to the actuator assembly 27.

Figure 2:
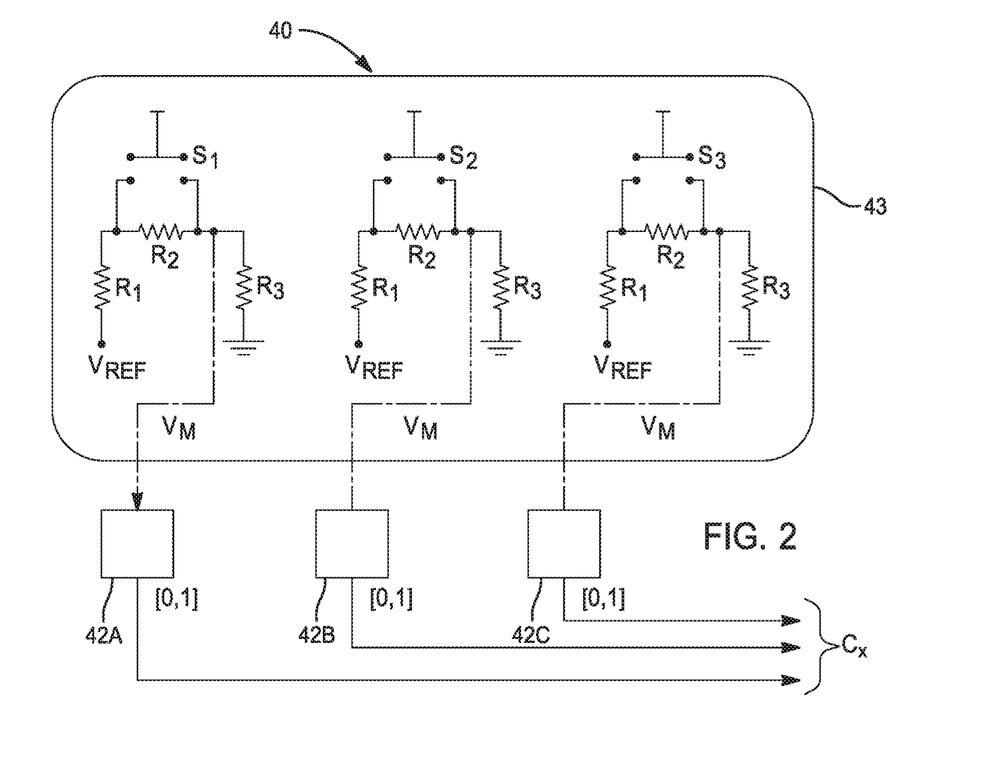
FIG. 2 is a schematic circuit diagram of an example pushbutton with three redundant switches for use in the vehicle shown in FIG. 1 according to an exemplary embodiment.

In the present disclosure, actuating a given one of the pushbuttons 11B shown in FIG. 1 ultimately results in the generation of a range request signal (arrow $C_{RS}$) or other electronic state selection signal, which is then communicated to the actuator assembly 27 by the controller 20. In an example embodiment, actuating a given one of the pushbuttons 11B generates an analog switch voltage signal, with the analog switch voltage signals indicated collectively in FIG. 1 as arrows Vsx. The switch voltage signals VSX are processed by one or more interface circuits 42, shown for simplicity as one unit in FIG. 1. The interface circuits may be alternatively embodied as multiple circuits 42A, 42B, and 42C as shown in FIG. 2, and/or may be integrated into the controller 20. The interface circuits 42 may include analog to digital (A/D) converters. The interface circuits 42 may also include switch debounce circuits. Alternatively or additionally, switch debouncing may be performed digitally within the controller 20. Corresponding sets of binary (0 or 1) switch state signals for each pushbutton 11B, i.e., $C_P$, $C_R$, $C_N$, $C_D$, or $C_L$, collectively $CC_X$ in FIG. 1, are then transmitted to the controller 20, which in turn transmits the range request signal ($C_{RS}$) to the actuator assembly 27 to request a desired operating range.

The controller 20 of the present disclosure is depicted as a single device for illustrative clarity. When so configured, the controller 20 may be embodied as a transmission control module or any other suitable vehicle controller. However, the controller 20 may be decentralized into multiple control chips, microprocessors, or control modules to provide the functionality detailed below. Embodiments of the controller 20 may therefore include a processor P and sufficient amounts of memory M, at least some of which is tangible and non-transitory to include the instructions needed for implementing the method 100. For instance, the memory M may include sufficient read only memory (ROM), random access memory (RAM), electrically-programmable read-only memory (EPROM), flash memory, etc., and any required circuitry including but not limited to a high-speed clock (not shown), analog-to-digital (A/D) circuitry, digital-to-analog (D/A) circuitry, a digital signal processor (DSP), and the necessary input/output (I/O) devices and other signal conditioning and/or buffer circuitry. Among other possible tasks, the controller 20 is specifically programmed to execute instructions embodying the method 100. In a non-limiting embodiment, the method 100 may include hierarchical state machines 300 and 400 and algorithms 500 and 600 as described below with reference to FIGS. 3, 4, 5, and 6.

An example circuit implementation 40 includes a representative pushbutton B as shown in FIG. 2. The pushbutton B used in this illustrative example may be any one of the P, R, N, D, and L pushbuttons shown in the example range shifter assembly 11 of FIG. 1. The pushbutton B is coupled to a plurality of redundant underlying switches. An example design uses exactly three redundant switches $S_1$, $S_2$, and $S_3$. More redundant switches may be used without departing from the intended inventive scope. However, as the three-switch example embodiment provides a good balance of performance, reliability, and minimal component count, the three-switch design of FIG. 2 will be used hereinafter for illustrative consistency.

In a three-switch system, closure of all three redundant switches $S_1$, $S_2$, and $S_3$ should indicate a "selected" state of the pushbutton B with a high degree of confidence. That is, if all three redundant switches $S_1$, $S_2$, and $S_3$ are closed at any given point in time, this conventionally indicates that the pushbutton B has in fact been selected. However, it is recognized herein that certain errant switch closure patterns may occur, whether due to an electrical fault, an uneven button actuating force, or a transient electrical error. That is, fewer than all of the redundant switches $S_1$, $S_2$, and $S_3$ may close when the pushbutton B is selected, or some of the switches $S_1$, $S_2$, and/or $S_3$ may close at different points in time. As used herein, the phrase "button selection" indicates that a button is considered to be "selected" for control purposes associated with the button. The controller 20 of FIG. 1 is programmed to closely monitor the closed/open binary states and temporal coincidence of any button state transitions for each the redundant switches $S_1$, $S_2$, and $S_3$, and to determine by a suitable algorithm that a given pushbutton B is selected only when the binary states of the redundant switches $S_1$, $S_2$, and $S_3$ meet predetermined button state conditions.

The example switch configuration of FIG. 2 may be embodied as a silicon or other dome-type pushbutton design. A cap 43 may span the redundant switches S1, S2, and S3. The shape, materials, and cosmetic finish of the cap 43 may vary with the intended design. For example, if a rigid version of the cap 43 is used, such as a molded hard plastic cap, the cap 43 may be spring-biased so that the cap 43 quickly returns to a released position after the pushbutton B is released. Alternatively, the cap 43 may be constructed of silicon, rubber, or other resilient material, such that the cap 43 itself is sufficiently resilient, i.e., able to return to its released position via its own resilience. In all designs, force acting on the cap 43 when the cap 43 is actuated is intended to close the redundant switches $S_1$, $S_2$, and $S_3$.

Beneath the cap 43, each redundant switch $S_1$, $S_2$, and $S_3$ may be electrically connected to a respective one of the interface circuits 42A, 42B, and 42C noted above, and optionally to a set of resistors $R_1$, $R_2$, $R_3$. The interface circuits 42A, 42B, 42C may be part of the controller 20 of FIG. 1 or a separate device(s). The redundant switches $S_1$, $S_2$, and $S_3$ are also electrically connected to a reference voltage supply (VREF), for instance a 5 VDC supply, which may be either a DC battery, DC lead of a printed circuit board assembly, or an auxiliary voltage output of a DC-DC converter (not shown). Actuation of the cap 43 closes the redundant switches $S_1$, $S_2$, and/or $S_3$.

A closed switch will provide a DC voltage for that particular switch in the range of 1-4 VDC in a non-limiting example 5 VDC embodiment to one of the A/D converters in interface circuits 42A, 42B, and 42C. The particular voltage range in practice will depend on the resistance values selected for resistors $R_1$, $R_2$, $R_3$ for each redundant switch S1, S2, and S3. That is, the resistors $R_1$, $R_2$, $R_3$ are selected in the design phase to regulate the reference voltage supply (VREF) to a lower voltage range, and to provide a positive voltage such as 1 VDC when the switch is open. Absent the resistors $R_1$, $R_2$, $R_3$, one would not be able to readily discern the difference between an open switch and an open circuit, e.g., a broken conductor.

The A/D converters in the interface circuits 42A, 42B, and 42C, as is well known in the art, are operable to convert an analog measured voltage (VM) to a corresponding digital output, which in this instance is a binary state of 0 or 1. For example, a VDC input of 1 VDC may correspond to an open switch $S_1$, $S_2$, or $S_3$, and thus correspond to a binary value of 0, while a closed switch should provide 4 VDC to the respective A/D converter in the interface circuit 42A, 42B, or 42C, which in turn corresponds to a binary value of 1. Voltage values falling anywhere between the predefined/calibrated voltage range of 1-4 VDC may be treated as faults by the controller 20.

The A/D converters in the interface circuits 42A, 42B, and 42C may be optionally configured to treat a small range of DC voltages as corresponding to one of the two binary values, e.g., an analog measured voltage (VM) in the range of 0.95-1.05 VDC as corresponding to a binary value of 0 and an analog range of 3.95-4.05 VDC as corresponding to a binary value of 1. As the redundant switches $S_1$, $S_2$, and $S_3$ are expected to be either open or closed, any voltage values falling in between the limits of the defined range, nominally [1, 4] VDC in the simplified example of FIG. 2, should be rare or non-existent.

Other switch designs may be envisioned within the scope of the present disclosure, and therefore the dome-type embodiment of FIG. 2 is intended to be non-limiting. For example, pressing on the pushbutton B may move magnetic plungers toward a plurality of Hall-effect sensors (not shown), with the switching voltage in this instance being related to the proximity of the magnetic plungers to the Hall-effect sensors. The interface circuits 42A, 42B, and 42C could function identically in such an alternative design, with the voltage output of the Hall-effect sensors being converted to a binary switch state signal. Alternatively, coupling between the pushbutton cap 43 and the switches could use other means such as capacitive or optical as are known in the art without departing from the intended inventive scope.

As used herein the term "button activation" differs from the term "button selection". The button is considered to be activated when it is identified as having been "pressed", even if the states of the underlying switches do not satisfy the requirements to identify the button as "selected" for control purposes associated with the button. By way of non-limiting example, depending on the algorithm that determines button selection a button may be considered "selected" if two or three of the three underlying switches are closed, while the button may be recognized as "activated" when only one of the three underlying switches are closed.

Figure 3:
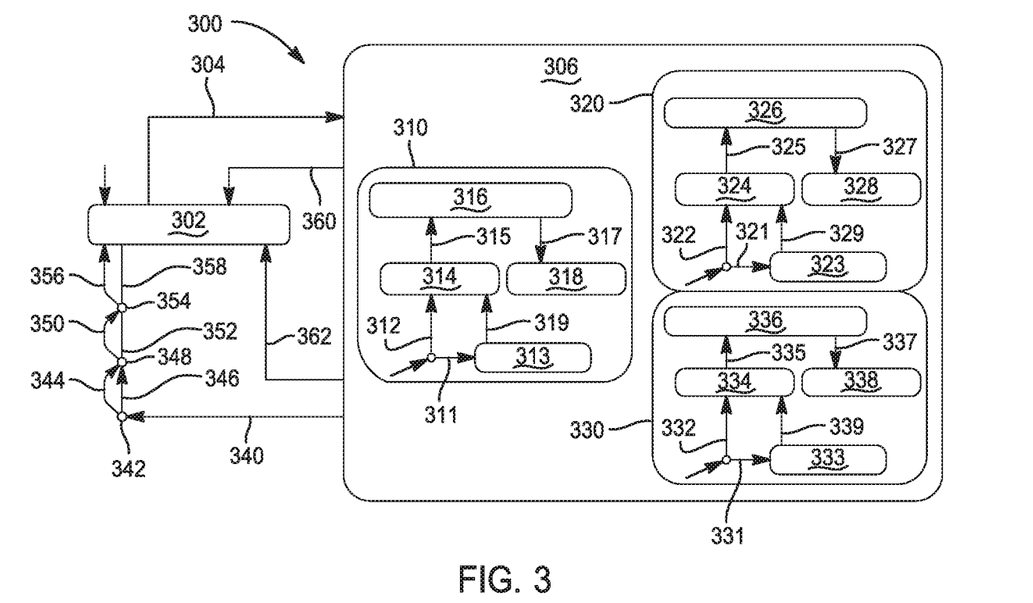
FIG. 3 is a state transition diagram of a state machine for counting open/closed statuses for a plurality of underlying switches associated with a given pushbutton according to an exemplary embodiment.

FIG. 3 illustrates aspects of an exemplary embodiment of a hierarchical state machine 300 used to count the number of times a switch is opened or closed. Before feeding the status of each switch to the state machine the switch signals are debounced for both open-to-closed transitions (for detecting closed status) and closed-to-open transitions (for detecting open status). A long debounce time is used to get a confirmation that a switch is definitely opened or closed. In the state machine illustrated in FIG. 3, signals with a long debounce time are used in transitions described as "confirmed". A shorter debounce time is used for other transitions in the exemplary state machine 300, while switch signals without debouncing are used for still other transitions in the state machine 300, as will be explained further in the following description.

With reference to FIG. 3, at starting Button Inactive state 302, the button 11B is not activated, and the action in state 302 is to clear a button-activation counter. When diagnostics are enabled and when any one of the switches is confirmed closed, i.e. when any of the debounced switch signals with a long debounce time indicates a closed status for that switch, the state transitions along transition path 304 to Button Activated state 306. At state 306, a flag is set to indicate the button has been activated and a button-activation counter is incremented.

With continued reference to FIG. 3, state 306 includes a sub-state 310 to track and count closed and open statuses of the first underlying switch, a sub-state 320 to track and count closed and open statuses of the second underlying switch, and a third sub-state 330 to track and count closed and open statuses of the third underlying switch.

Operation of the sub-state 310 will now be described. Upon entering sub-state 310, if the first underlying switch signal with the shorter debounce time applied is recognized as closed the state transitions along transition path 312 to state 314. At state 314 the switch-closed counter for the first underlying switch is incremented. If the first underlying switch signal with no debounce is then recognized as opening the state transitions along transition path 315 to state 316; if the first underlying switch is then recognized as open with the shorter debounce time applied the state transitions along transition path 317 to state 318. At state 318 the switch-opened counter for the first underlying switch is incremented.

If upon entering sub-state 310 the first underlying switch is open, the state transitions along transition path 311 to state 313. If the first underlying switch signal with the shorter debounce time applied is recognized as closed while in state 313, the state transitions along transition path 319 to state 314.

Operation of the sub-state 320 will now be described. Upon entering sub-state 320, if the second underlying switch signal with the shorter debounce time applied is recognized as closed the state transitions along transition path 322 to state 324. At state 324 the switch-closed counter for the second underlying switch is incremented. If the second underlying switch signal with no debounce is then recognized as opening the state transitions along transition path 325 to state 326; if the second underlying switch is then recognized as open with the shorter debounce time applied the state transitions along transition path 327 to state 328. At state 328 the switch-opened counter for the second underlying switch is incremented.

If upon entering sub-state 320 the second underlying switch is open, the state transitions along transition path 321 to state 323. If the second underlying switch signal with the shorter debounce time applied is recognized as closed while in state 323, the state will transition along transition path 329 to state 324.

Operation of the sub-state 330 will now be described. Upon entering sub-state 330, if the third underlying switch signal with the shorter debounce time applied is recognized as closed the state transitions along transition path 332 to state 334. At state 334 the switch-closed counter for the third underlying switch is incremented. If the third underlying switch signal with no debounce is then recognized as opening the state transitions along transition path 335 to state 336; if the third underlying switch is then recognized as open with the shorter debounce time applied the state transitions along transition path 337 to state 338. At state 338 the switch-opened counter for the third underlying switch is incremented.

If upon entering sub-state 330 the first underlying switch is open, the state transitions along transition path 331 to state 333. If the first underlying switch signal with the shorter debounce time applied is recognized as closed while in state 333, the state will transition along transition path 339 to state 334.

When all of the first underlying switch, the second underlying switch, and the third underlying switch are confirmed open, i.e. when all of the debounced switch signals with a long debounce time indicate an open status for all switches the state transitions from state 306 to decision point 342 along transition path 340.

At decision point 342, if it is determined that the last state before exiting sub-state 310 was state 313, the open counter for the first underlying switch is incremented along transition path 344 and the state transitions to decision point 348. If the last state before exiting sub-state 310 was not state 313, the state transitions to decision point 348 along transition path 346 without incrementing the open counter for the first underlying switch.

At decision point 348, if it is determined that the last state before exiting sub-state 320 was state 323, the open counter for the second underlying switch is incremented along transition path 350 and the state transitions to decision point 354. If the last state before exiting sub-state 320 was not state 323, the state transitions to decision point 354 along transition path 352 without incrementing the open counter for the second underlying switch.

At decision point 354, if it is determined that the last state before exiting sub-state 330 was state 333, the open counter for the third underlying switch is incremented along transition path 356 and the state transitions to state 302. If the last state before exiting sub-state 330 was not state 333, the state transitions to state 302 along transition path 358 without incrementing the open counter for the third underlying switch.

The state machine 300 illustrated in FIG. 3 also includes provision for exiting the Button Activated state 306 along transition path 360 to Button Inactive state 302 when the button-activation counter is cleared. The state machine 300 also includes provision for exiting the Button Activated state 306 along transition path 369 to Button Inactive state 302 when diagnostics are disabled.

As used herein, the term "button activation event" refers to a time period that begins when any one of the underlying switches associated with the button is confirmed closed and that ends when all of the underlying switches associated with the button are confirmed open.

The operation of the state machine 300 may be summarized as follows. In this state machine, when a switch is confirmed closed, the Button-Activation counter is incremented. The Switch-Closed counter for the switches that are closed are also incremented. If a switch is then opened, the Switch-Opened counter for that switch is incremented. If that switch is closed and opened again, the Switch-Closed counter and the Switch-Opened counter are not incremented again. In other words, after the button is considered activated, the Switch-Opened and/or Switch-Closed counter for a switch is incremented only once. When all switches are confirmed open, when the Button-Activation counter is cleared, or when diagnostics are disabled, the control transitions to Button Inactive state. When all switches are confirmed open and the transition to Button Inactive state occurs, if a switch had never been closed its Switch-Opened counter is incremented.

As implied by the above state machine, there is a Switch-Opened counter and a Switch-Closed counter for each switch. There is also a Button-Activation counter. Since all the counters are reset once a fault in any of the switches is detected or cleared, there should be three streams of algorithms; one for each switch. Thus, an identical set of counters are used for each stream of algorithm. Each set of counters will have Switch-Closed counters for switches 1, 2 and 3, Switch-Opened counters for switches 1, 2 and 3, and a Button-Activation counter, i.e. a total of 7 counters for the algorithm stream for each button, assuming three underlying switches for each button.

Figure 4:
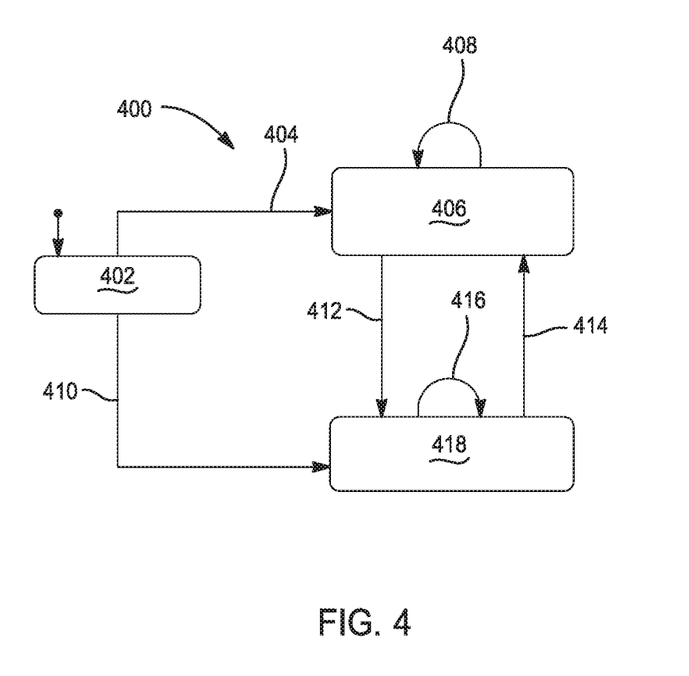
FIG. 4 is a state transition diagram of a state machine for processing counters associated with one of the underlying switches according to an exemplary embodiment.

As the Switch-Opened and Switch-Closed counters are incremented, there is logic to continuously monitor those values. Assuming three underlying switches per button, there are three streams of identical algorithms to track the three sets of counters. FIG. 4 depicts an exemplary state machine 400 that may be used on each stream. Note that each stream pertains to each switch.

Associated with the algorithm depicted in FIG. 4 are two functions that indicate if the switch associate with this algorithm stream. The first of these functions, referred to herein as "Is Switch Not Stuck Open" and described below with reference to FIG. 5, indicates if the switch can be determined to be "not stuck open". The second of these functions, referred to herein as "Is Switch Stuck Open" and described below with reference to FIG. 6, indicates if the switch can be determined to be "stuck open".

Referring to FIG. 4, entry state 402 may be considered a "Switch Fault Not Determined" state. If the "Is Switch Not Stuck Open" function described below with reference to FIG. 5 confirms that the switch is not stuck open, the state machine 400 transitions along state transition path 404 to state 406. State 406 can be considered a "Switch not stuck open" state. Upon entering state 406, a "stuck open fault" flag for this switch is cleared, and the counters for this stream of algorithm that pertains to the specific switch are reset. When in state 406, if a subsequent evaluation of the "Is Switch Not Stuck Open" function confirms that the switch is not stuck open, the state machine 400 loops along state transition path 408 back to state 406.

With continued reference to FIG. 4, when in state 402 if the "Is Switch Stuck Open" function described below with reference to FIG. 6 confirms that the switch is stuck open, the state machine 400 transitions along state transition path 410 to state 418. State 418 can be considered a "Switch stuck open" state. Upon entering state 418, the "stuck open fault" flag for this switch is set, and the counters for this stream of algorithm that pertains to the specific switch are reset. When in state 418, if a subsequent evaluation of the "Is Switch Stuck Open" function confirms that the switch is stuck open, the state machine 400 loops along state transition path 416 back to state 418.

Figure 5:
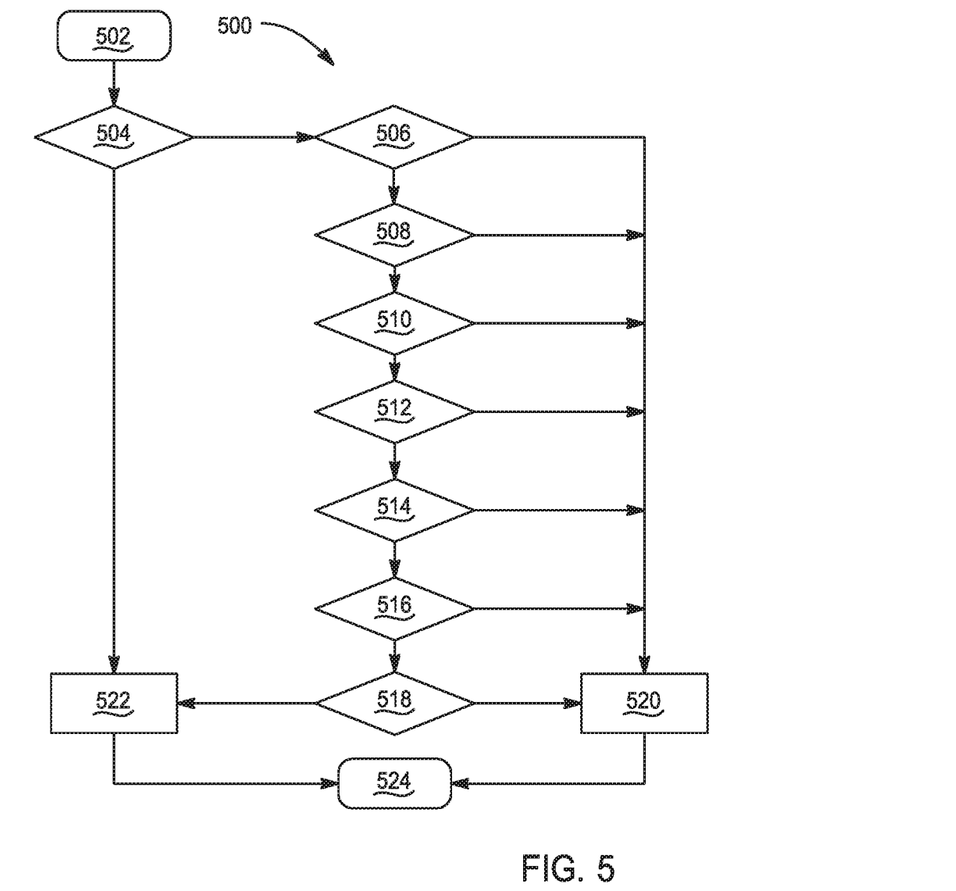
FIG. 5 is a flow chart of an algorithm for confirming that a given pushbutton does not have an underlying switch stuck open according to an exemplary embodiment.

Continuing to refer to FIG. 4, if the state machine 400 is in state 406 and an evaluation of the "Is Switch Stuck Open" function confirms that the switch is stuck open, the state machine 400 transitions along state transition path 412 to state 418. If the state machine 400 is in state 418 and an evaluation of the "Is Switch Not Stuck Open" function confirms that the switch is not stuck open, the state machine 400 transitions along state transition path 414 to state 406. The algorithms described below with respect to FIG. 5 and FIG. 6 show exemplary algorithms that can evaluate the "Is Switch Stuck Open" and "Is Switch Not Stuck Open" functions for the first underlying switch. Similar algorithms can be used to evaluate these functions for the second and third underlying switches by appropriate rearrangement of the Switch 1 counters, Switch 2 counters, and Switch 3 counters in the algorithms described below.

FIG. 5 is a flowchart that describes an exemplary algorithm 500 suitable for performing the "Is Switch Not Stuck Open" function described above. The algorithm 500 enters at step 502 and proceeds to step 504. Step 504 tests to determine if diagnostics are enabled. If diagnostics are not enabled, the algorithm 500 proceeds to step 522. If diagnostics are enabled, the algorithm proceeds to step 506.

In step 506, the following conditions are evaluated: (a) the Button Activation counter is greater than or equal to the predetermined minimum button activation threshold required for a pass; and (b) the button is not currently activated. If both conditions (a) and (b) are true the algorithm proceeds to step 520, otherwise the algorithm proceeds to step 508.

In step 508, the following conditions are evaluated: (c) the Button Activation counter is greater than or equal to the maximum threshold required for a passing diagnostic for concurrent switch presses; and (d) Switch-1-Closed counter is greater than or equal to a predetermined maximum percentage of Button activations required for a pass with concurrent switch presses; and (e) Switch-1-Opened counter is greater than or equal to Switch-1-Closed counter; and (f) Switch-1-Closed counter is less than or equal to a predetermined minimum percentage of Button activations that indicate a suspicious number of closures; and (g) Switch-2-Closed counter is greater than or equal to a predetermined maximum percentage of Button activations required for a pass with concurrent switch presses; and (h) Switch-2-Opened counter is greater than or equal to Switch-1-Closed counter; and (i) Switch-2-Closed counter is less than or equal to a predetermined minimum percentage of Button activations that indicate a suspicious number of closures; and (j) Switch 1's stuck open fault is not currently active and the button is not currently activated. If all of the conditions (c) through (j) are true the algorithm proceeds to step 520, otherwise the algorithm proceeds to step 510.

In step 510, the following conditions are evaluated: (k) Button-Activation counter is greater than or equal to minimum threshold required for a passing diagnostic for concurrent switch presses; and (l) Switch-1-Closed counter is greater than or equal to a predetermined minimum percentage of Button activations required for a pass with concurrent switch presses; and (m) Switch-1-Opened counter is greater than or equal to Switch-1-Closed counter; and (n) Switch-1-Closed counter is less than or equal to a predetermined minimum percentage of Button activations that indicate a suspicious number of closures; and (o) Switch-3-Closed counter is greater than or equal to a predetermined maximum percentage of Button activations required for a pass with concurrent switch presses; and (p) Switch-3-Opened counter is greater than or equal to Switch-1-Closed counter; and (q) Switch-3-Closed counter is less than or equal to a predetermined minimum percentage of Button activations that indicate a suspicious number of closures; and (r) Switch 1's stuck open fault is not currently active and the button is not currently activated. If all of the conditions (k) through (r) are true the algorithm proceeds to step 520, otherwise the algorithm proceeds to step 512.

In step 512, the following conditions are evaluated: (s) Button-Activation counter is greater than or equal to maximum threshold required for a passing diagnostic for alternate switch presses; and (t) Switch-1-Closed counter is greater than or equal to a predetermined maximum percentage of Button activations required for a pass with alternate switch presses; and (u) Switch-1-Opened counter is greater than or equal to Switch-1-Closed counter; and (v) Switch-2-Closed counter is greater than or equal to a predetermined maximum percentage of Button activations required for a pass with alternate switch presses; and (w) Switch-2-Opened counter is greater than or equal to Switch-1-Closed counter;

and (x) the button is not currently activated. If all of the conditions (s) through (x) are true the algorithm proceeds to step 520, otherwise the algorithm proceeds to step 514.

In step 514, the following conditions are evaluated: (y) Button-Activation counter is greater than or equal to maximum threshold required for a passing diagnostic for alternate switch presses; and (z) Switch-1-Closed counter is greater than or equal to a predetermined maximum percentage of Button activations required for a pass with alternate switch presses; and (aa) Switch-1-Opened counter is greater than or equal to Switch-1-Closed counter; and (bb) Switch-3-Closed counter is greater than or equal to a predetermined maximum percentage of Button activations required for a pass with alternate switch presses; and (cc) Switch-3-Opened counter is greater than or equal to Switch-1-Closed counter; and (dd) the button is not currently activated. If all of the conditions (y) through (dd) are true the algorithm proceeds to step 520, otherwise the algorithm proceeds to step 516.

In step 516, the following conditions are evaluated: (ee) Button-Activation counter is greater than or equal to maximum threshold required for a passing diagnostic for random switch presses; and (ff) Switch-1-Closed counter is greater than or equal to a predetermined maximum percentage of Button activations required for a pass with random switch presses; and (gg) Switch-1-Opened counter is greater than or equal to a predetermined maximum percentage of Button activations required for a pass with random switch presses; and (hh) Switch-2-Closed counter is greater than or equal to a predetermined maximum percentage of Button activations required for a pass with random switch presses; and (ii) Switch-2-Opened counter is greater than or equal to a predetermined maximum percentage of Button activations required for a pass with random switch presses; and (jj) the button is not currently activated. If all of the conditions (ee) through (jj) are true the algorithm proceeds to step 520, otherwise the algorithm proceeds to step 518.

In step 518, the following conditions are evaluated; (kk) Button-Activation counter is greater than or equal to maximum threshold required for a passing diagnostic for random switch presses; and (ll) Switch-1-Closed counter is greater than or equal to a predetermined maximum percentage of Button activations required for a pass with random switch presses; and (mm) Switch-1-Opened counter is greater than or equal to a predetermined maximum percentage of Button activations required for a pass with random switch presses; and (nn) Switch-3-Closed counter is greater than or equal to a predetermined maximum percentage of Button activations required for a pass with random switch presses; and (oo) Switch-3-Opened counter is greater than or equal to a predetermined maximum percentage of Button activations required for a pass with random switch presses; and (pp) the button is not currently activated. If all of the conditions (kk) through (oo) are true the algorithm proceeds to step 520, otherwise the algorithm proceeds to step 522.

The algorithm 500 reaches step 520 when it is confirmed that the switch is not stuck open. Referring back to FIG. 4, the algorithm 500 reaching step 520 results in the state machine 400 transitioning to state 406 by way of transition path 404, 408, or 414. After step 520, the algorithm 500 exits through step 524.

The algorithm 500 reaches step 522 when a switch not stuck open condition cannot be confirmed. Reaching step 522 will not cause any transitions of state machine 400 in FIG. 4. After step 522, the algorithm 500 exits through step 524.

Figure 6:
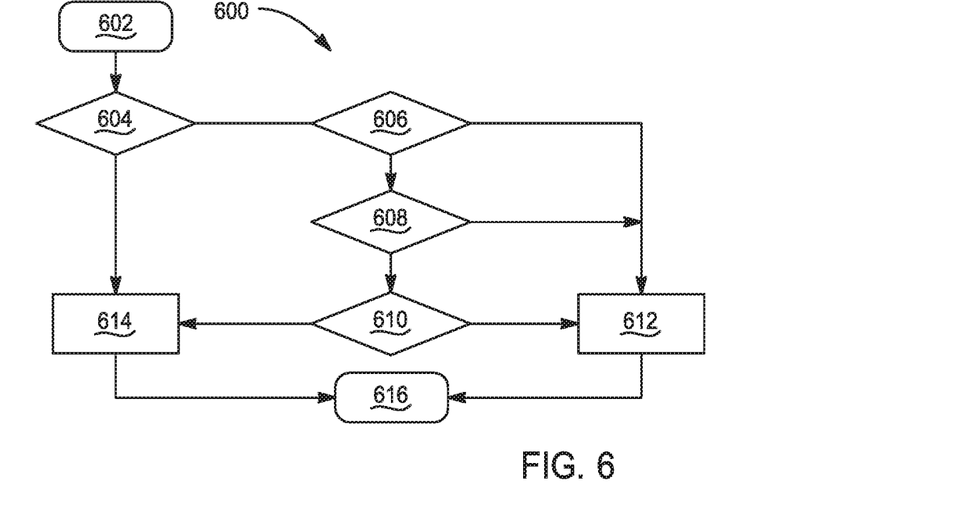
FIG. 6 is a flow chart of an algorithm for confirming that a given pushbutton does have an underlying switch stuck open according to an exemplary embodiment.

FIG. 6 is a flowchart that describes an exemplary algorithm 600 suitable for performing the "Is Switch Stuck Open" function described above. The algorithm 600 enters at step 602 and proceeds to step 604.

In step 604 the following conditions are evaluated: (qq) Button-Activation counter is greater than or equal to the predetermined minimum threshold required for evaluating a failure; and (rr) the diagnostic is enabled. If both conditions (qq) and (rr) are true the algorithm 600 proceeds to step 606, otherwise the algorithm 600 proceeds to step 614.

In step 606 the following conditions are evaluated: (ss) Switch-1-Closed count is less than or equal to a predetermined minimum percentage of Button activations required for a failure; and (tt) Switch-2-Closed count is greater than or equal to a predetermined maximum percentage of Button activations required for a failure. If both conditions (ss) and (tt) are true the algorithm 600 proceeds to step 612, otherwise the algorithm 600 proceeds to step 608.

In step 608 the following conditions are evaluated: (uu) Switch-1-Closed count is less than or equal to a predetermined minimum percentage of Button activations required for a failure; and (vv) Switch-3-Closed count is greater than or equal to a predetermined maximum percentage of Button activations required for a failure. If both conditions (uu) and (vv) are true the algorithm 600 proceeds to step 612, otherwise the algorithm 600 proceeds to step 610.

In step 610 the following conditions are evaluated: (ww) Switch-1-Closed count is less than or equal to a predetermined minimum percentage of Button activations required for a failure; and (xx) The sum of Switch-2-Closed count and Switch-3-Closed count is greater than or equal to a predetermined maximum percentage of Button activations required for a failure. If both conditions (uu) and (vv) are true the algorithm 600 proceeds to step 612, otherwise the algorithm 600 proceeds to step 614.

The algorithm 600 reaches step 612 when it is confirmed that the switch is stuck open. Referring back to FIG. 4, the algorithm 600 reaching step 612 results in the state machine 400 transitioning to state 418 by way of transition path 410, 412, or 416. After step 612, the algorithm 600 exits through step 616.

The algorithm 600 reaches step 614 when a switch stuck open condition cannot be confirmed. Reaching step 614 will not cause any transitions of state machine 400 in FIG. 4. After step 614, the algorithm 600 exits through step 616.

In the foregoing descriptions of algorithm 500 and algorithm 600, the button activation counter, switch-opened counters, and switch-closed counters are compared to several listed parameters. These parameters have numerical values that can be provided to the algorithms as calibration values. In an exemplary embodiment, the predetermined minimum button activation threshold required for a pass has a value of 9 counts. In an exemplary embodiment, the maximum threshold required for a passing diagnostic for concurrent switch presses has a value of 1 count. In an exemplary embodiment, the predetermined maximum percentage of Button activations required for a pass with concurrent switch presses has a value of 90%. In an exemplary embodiment, the predetermined minimum percentage of Button activations that indicate a suspicious number of closures has a value of 110%. In an exemplary embodiment, the maximum threshold required for a passing diagnostic for alternate switch presses has a value of 3 counts. In an exemplary embodiment, the predetermined maximum percentage of Button activations required for a pass with alternate switch presses has a value of 10%. In an exemplary embodiment, the maximum threshold required for a passing diagnostic for random switch presses has a value of 5 counts. In an exemplary embodiment, the predetermined maximum percentage of Button activations required for a pass with random switch presses has a value of 30%. In an exemplary embodiment, the predetermined minimum threshold required for evaluating a failure and the diagnostic is enabled is 7 counts. In an exemplary embodiment, the predetermined minimum percentage of Button activations required for a failure has a value of 8%. In an exemplary embodiment, the predetermined maximum percentage of Button activations required for a failure has a value of 80%.

Using the method 100 described above, each switch coupled to a given pushbutton is diagnosed separately for a stuck open condition by tracking multiple closed or open events within a single confirmed button activation. For a pushbutton having three underlying switches, this means that three separate algorithm streams and three separate sets of counters are used. The switch in question is then compared to the remaining two switches. The method is made robust by summarizing multiple switch presses occurring within a button activation event to one closure and one opening. If a switch did not close after a button is activated, the switch-opened count for that switch is incremented. The number of switch-opened counts is compared to the number of switch-closed counts for the same switch, making the diagnostic method robust against false passes. The diagnostic method also includes comparing the switch in question to the summation of counts of the other two switches. Those having ordinary skill in the art will also appreciate that, while the pushbutton shifter assembly 11 of FIG. 1 is the type of pushbutton system that may benefit from use of the method 100, other pushbutton actuators may be readily envisioned, both vehicular and non-vehicular, that control essential system operations in response to by-wire commands. Therefore, the method 100 and controller 20 are not strictly limited to use in transmission range selection. Indeed, all that is required is a by-wire connection of a controller to a pushbutton, with depression of the pushbutton closing multiple redundant switches to request a particular operation of a system. The logic underlying the disclosed method 100 will still operate effectively in such alternative applications.

In an exemplary embodiment, the fault status for each switch, i.e. the switch is stuck open or the switch is not stuck open, will be saved in the controller 20. In an exemplary embodiment, a fault status that indicates the need for action such as taking the vehicle for service will be reported to the vehicle operator by such means as a dashboard display and/or an audible warning. The fault status of the switches may also be reported to a diagnostic scanning device (not shown) connected to the controller 20 by a diagnostic connector mounted to the vehicle.

A diagnostic method of the present disclosure offers several advantages. One advantage is the ability to recognize degradation of the operation of an individual switch before degradation proceeds to the point of impairing recognition of button selection. This allows the user to be notified in advance of an impending loss of functionality, so that appropriate service can be performed. Another advantage is the ability to specifically recognize which switch has degraded, thereby allowing service personnel to identify specific components to be replaced.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A method for detecting a failure mode in an electronic selector having a button coupled to a first switch, a second switch, and a third switch, the method comprising:
   incrementing a button activation counter once for each button activation event;
   incrementing a first switch-closed counter once for each button activation event if the first switch is closed at any time during the button activation event;
   incrementing a second switch-closed counter once for each button activation event if the second switch is closed at any time during the button activation event;
   incrementing a third switch-closed counter once for each button activation event if the third switch is closed at any time during the button activation event;
   incrementing a first switch-opened counter once for each button activation event;
   incrementing a second switch-opened counter once for each button activation event;
   incrementing a third switch-opened counter once for each button activation event;
   evaluating a fault status of the first switch, the second switch, or the third switch by analyzing values of the first switch-closed counter, and/or the second switch-closed counter, and/or the third switch-closed counter, and/or the first switch-opened counter, and/or the second switch-opened counter, and/or the third switch-opened counter when the button activation counter reaches or exceeds a predetermined threshold; and
   reporting the fault status of the first switch, the second switch or the third switch.

2. The method of claim 1, wherein the fault status is that a switch not stuck open status is confirmed.

3. The method of claim 1, wherein the fault status is that a switch not stuck open status cannot be confirmed.

4. The method of claim 1, wherein the fault status is that a switch stuck open status is confirmed.

5. The method of claim 1, wherein the fault status is that a switch stuck open status cannot be confirmed.

6. The method of claim 1, wherein:
   a first open-to-closed debounce time is applied to signals from the first switch, the second switch, and the third switch;
   a first closed-to-open debounce time is applied to signals from the first switch, the second switch, and the third switch;
   the button activation event is commenced when one of the first switch with the first open-to-closed debounce time applied, the second switch with the first open-to-closed debounce time applied, and the third switch with the first open-to-closed debounce time applied is recognized as closed; and
   the button activation event is concluded when the first switch with the first closed-to-open debounce time applied, the second switch with the first closed-to-open debounce time, and the third switch with the first closed-to-open debounce time applied are all recognized as open.

7. The method of claim 6, wherein
   a second open-to-closed debounce time is applied to signals from the first switch, the second switch, and the third switch, the second open-to-closed debounce time being shorter than the first open-to-closed debounce time; and
   recognition that the first switch is closed in the step of incrementing the first switch-closed counter once if the first switch is closed at any time during the button activation event is based on the signal from the first switch with the second open-to-closed debounce time applied.

8. The method of claim 1 further including the step of reporting an impending failure of the button when the fault status is that a stuck open status is detected for only one of the three switches.

9. The method of claim 1 further including the step of reporting a total failure of the button when the fault status is that a stuck open status is detected for two of the three switches.

10. The method of claim 1 further including the step of reporting a no button latent failure is confirmed status when the fault status is that that a switch not stuck open status can be confirmed for all three of the switches.

11. A system comprising an electronic selector having a button coupled to a first switch, a second switch, and a third switch, and a controller in electrical communication with the first switch, the second switch, and the third switch, the controller configured to:
   increment a button activation counter once for each button activation event;
   increment a first switch-closed counter once for each button activation event if the first switch is closed at any time during the button activation event;
   increment a second switch-closed counter once for each button activation event if the second switch is closed at any time during the button activation event;
   increment a third switch-closed counter once for each button activation event if the third switch is closed at any time during the button activation event;
   increment a first switch-opened counter once for each button activation event;
   increment a second switch-opened counter once for each button activation event;
   increment a third switch-opened counter once for each button activation event;
   evaluate a fault status of the first switch, the second switch, or the third switch by analyzing values of the first switch-closed counter, and/or the second switch-closed counter, and/or the third switch-closed counter, and/or the first switch-opened counter, and/or the second switch-opened counter, and/or the third switch-opened counter when the button activation counter reaches or exceeds a predetermined threshold; and report the fault status of the first switch, the second switch or the third switch.

12. The system of claim 11, wherein the fault status is that a switch not stuck open status is confirmed.

13. The system of claim 11, wherein the fault status is that a switch not stuck open status cannot be confirmed.

14. The system of claim 11, wherein the fault status is that a switch stuck open status is confirmed.

15. The system of claim 11, wherein the fault status is that a switch stuck open status cannot be confirmed.

16. The system of claim 11, wherein:

a first open-to-closed debounce time is applied to signals from the first switch, the second switch, and the third switch;

a first closed-to-open debounce time is applied to signals from the first switch, the second switch, and the third switch;

the button activation event is commenced when one of the first switch with the first open-to-closed debounce time applied, the second switch with the first open-to-closed debounce time applied, and the third switch with the first open-to-closed debounce time applied is recognized as closed; and the button activation event is concluded when the first switch with the first closed-to-open debounce time applied, the second switch with the first closed-to-open debounce time, and the third switch with the first closed-to-open debounce time applied are all recognized as open.

17. The system of claim 16, wherein a second open-to-closed debounce time is applied to signals from the first switch, the second switch, and the third switch, the second open-to-closed debounce time being shorter than the first open-to-closed debounce time; and recognition that the first switch is closed in the step of incrementing the first switch-closed counter once if the first switch is closed at any time during the button activation event is based on the signal from the first switch with the second open-to-closed debounce time applied.

18. The system of claim 11 further including the step of reporting an impending failure of the button when the fault status is that a stuck open status is detected for only one of the three switches.

19. The system of claim 11 further including the step of reporting a total failure of the button when the fault status is that a stuck open status is detected for two of the three switches.

20. A controller comprising a processor and a non-transitory computer-readable medium containing instructions that, when executed, perform the method comprising the steps of:

incrementing a button activation counter once for each button activation event;

incrementing a first switch-closed counter once for each button activation event if a first switch is closed at any time during the button activation event;

incrementing a second switch-closed counter once for each button activation event if a second switch is closed at any time during the button activation event;

incrementing a third switch-closed counter once for each button activation event if a third switch is closed at any time during the button activation event;

incrementing a first switch-opened counter once for each button activation event;

incrementing a second switch-opened counter once for each button activation event;

incrementing a third switch-opened counter once for each button activation event;

evaluating a fault status of the first switch, the second switch, or the third switch by analyzing values of the first switch-closed counter, and/or the second switch-closed counter, and/or the third switch-closed counter, and/or the first switch-opened counter, and/or the second switch-opened counter, and/or the third switch-opened counter when the button activation counter reaches or exceeds a predetermined threshold; and reporting the fault status of the first switch, the second switch or the third switch.

\* \* \* \* \*